(12) United States Patent
McIntosh et al.

(10) Patent No.: US 6,265,235 B1
(45) Date of Patent: Jul. 24, 2001

(54) METHOD OF SECTIONING OF PHOTORESIST FOR SHAPE EVALUATION

(75) Inventors: John M. McIntosh; Erik C. Houge, both of Orlando; Brittin C. Kane, Clermont; Simon J. Molloy; Catherine Vartuli, both of Orlando, all of FL (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/383,154

(22) Filed: Aug. 25, 1999

(51) Int. Cl.[7] .................................................. H01L 21/66
(52) U.S. Cl. ................................. 438/16; 438/7; 430/30
(58) Field of Search ....................... 438/7, 16, FOR 101, 438/FOR 142; 430/30; 382/144, 145

(56) References Cited

U.S. PATENT DOCUMENTS

| | | |
|---|---|---|
| 5,338,997 | 8/1994 | Benecke . |
| 5,651,574 | 7/1997 | Tanikawa et al. . |
| 5,665,199 * | 9/1997 | Sahota et al. . |
| 5,741,614 * | 4/1998 | Mc Coy et al. . |
| 5,804,460 | 9/1998 | Bindell et al. . |
| 6,146,913 * | 11/2000 | Rafferty . |

OTHER PUBLICATIONS

Giannuzzi, et al., "Focused Ion Beam Milling and Micromanipulation Lift–Out for Site Specific Cross–Section TEM Specimen Preparation," Materials Res. Soc., Symp. Proc. vol. 480 pp 19–27 (1997).

* cited by examiner

Primary Examiner—George Fourson
Assistant Examiner—Michelle Estrada
(74) Attorney, Agent, or Firm—Fay, Sharpe, Fagan, Minnich & McKee, LLP

(57) ABSTRACT

A non-destructive method for evaluating a topographical feature 16 of an integrated circuit 42, such as a photoresist runner, includes core sectioning the feature to remove a small section 22, without damage to the remainder of the wafer 36 on which the integrated circuit is formed. A tool having fine adjustment, such as a micromanipulator with a rod-shaped probe 24 in the form of a glass needle, is used to remove the section for examination and metrology. The section is separated from the underlying substrate surface 14 and can be examined from all sides. Variations in a critical dimension, such as line width W, along the length L of the section, as well as average measurements of the dimension, can be obtained.

21 Claims, 5 Drawing Sheets

METHOD OF SECTIONING OF PHOTORESIST FOR SHAPE EVALUATION

FIELD OF THE INVENTION

The present invention relates to the integrated circuit processing arts. It finds particular application in the sampling of small sections of photoresist for profile examination, and will be described with particular reference thereto. It should be appreciated, however, that the technique is also applicable to the examination of sections of a variety of microscopic topographical features.

BACKGROUND OF THE INVENTION

During many of the steps involved in the manufacture of integrated circuits, features are defined by photolithographic methods. Careful control of the features is often essential for good performance of the integrated circuit. The features are difficult to measure using conventional optical techniques. The features are small, often about 1 micrometer in cross section, and the feature edges are not always perfectly straight and vertical (i.e., perpendicular to the underlying substrate). Often, the feature edges are sloped or irregular along the length of the feature. Consequently, a precise definition of the terms "feature width" and "feature height" is difficult.

Various techniques have been developed for measuring the pitch and width of features on a substrate. These include the use of scanning electron microscopes (both high voltage, using energies of 15–30 kV, and low voltage, using energies of typically less than 2 kV), scanning probe microscopes (Atomic Force Microscopy, etc.), and optical microscopes. Combinations of these techniques are often employed.

In the case of integrated circuits, a section through the circuit, including the feature to be examined, is generally cut and the exposed cross section is subjected to the selected measurement technique or techniques. Alternatively, a portion of the substrate is gouged out of the wafer, carrying with it the topographical feature to be examined. One method of sectioning an integrated circuit includes the use of a Focused Ion Beam (FIB) tool. An FIB produces a finely focussed ion beam, such as a beam of gallium ions, which can be directed at the wafer.

These method of measuring feature geometry, or "metrology" have a number of disadvantages. First, the taking of a section through the entire wafer destroys the wafer on which the circuit is formed. As wafers are manufactured with increasingly large diameters (20 cm, and above) the costs of the wafers increase accordingly and sectioning also becomes more difficult. It is therefore desirable that a non-destructive testing method be developed.

Second, the sectioning process used to cut the section tends to change the cross section of the feature to be examined, especially in the case of relatively soft materials, such as photoresist. FIB is particularly damaging to the soft photoresist material, leading to deformation of the cross section. Thus, the dimensions measured may not correspond to those which were present on the wafer prior to sectioning.

Third, the taking of a section permits only one cross section of the feature to be examined at the end of the section. It does not allow a measurement of the changes in cross section along the length of the feature. Additionally, the section taken may not be representative of the feature as a whole.

The present invention provides a new and improved method for examining a feature which overcomes the above-referenced problems, and others.

SUMMARY OF THE INVENTION

In accordance with one aspect of the present invention, a method of integrated circuit manufacturing is provided. The method includes forming a raised topographical feature on a substrate surface and removing a section of the feature from the substrate surface. The removal includes applying a force with a probe tip to a side of the feature to displace the section from the substrate surface and at least one adjacent portion of the feature and examining the removed section to determine whether a selected characteristic of the topographical feature meets a predetermined standard.

In accordance with one aspect of the present invention, a method of integrated circuit testing is provided. The method includes forming a raised topographical feature on a substrate surface and applying a force to a side of the topographical feature in a direction generally parallel with the substrate surface which causes a section of the feature to be severed from at least one adjacent remaining portion of the feature and disbonds the section from the substrate surface. The method further includes examining the removed section to determine whether a selected characteristic of the topographical feature meets a predetermined standard.

One advantage of the present invention is that it permits the evaluation of a feature of an integrated circuit without destruction of an entire wafer on which the circuit is formed.

Another advantage of the present invention is that it permits measurements of the change in feature dimensions along the length of the feature to be taken.

Another advantage of the present invention is that it permits all sides of the feature to be examined, including the surface in contact with the underlying substrate.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

A tool, such as a micromanipulator, is used to remove a small section of a feature of an integrated circuit, such as a section of photoresist, for examination and metrology. All of the steps of removal are preferably carried out in the clean room of a processing facility. The wafer from which the sample is taken is essentially undamaged in the sampling process and may be subjected to further processing or packaging ready for shipment.

Figure 1:
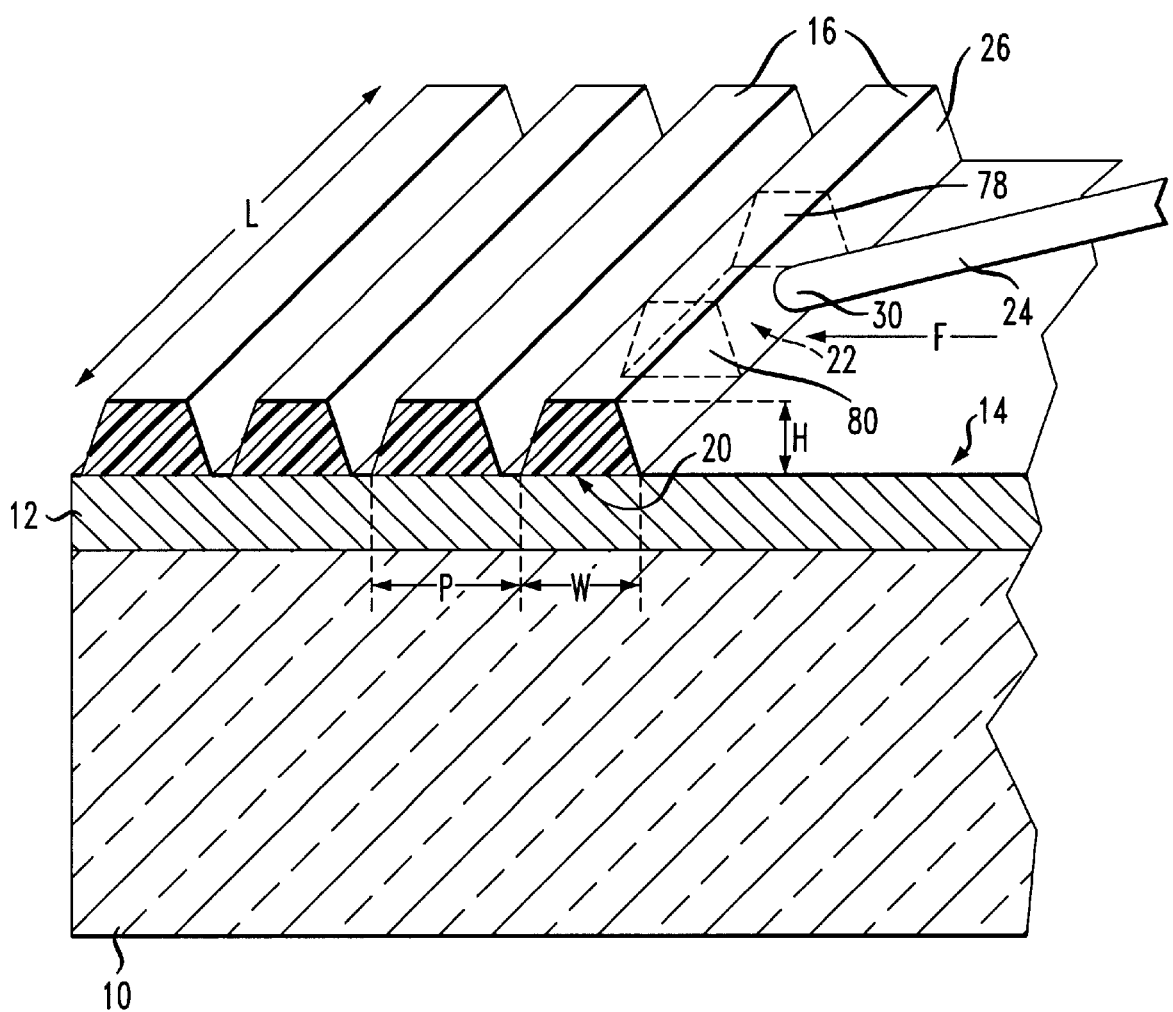
FIG. 1 is a perspective view of section through a wafer with photoresist patterns during removal of a sample of the photoresist.
Figure 2:
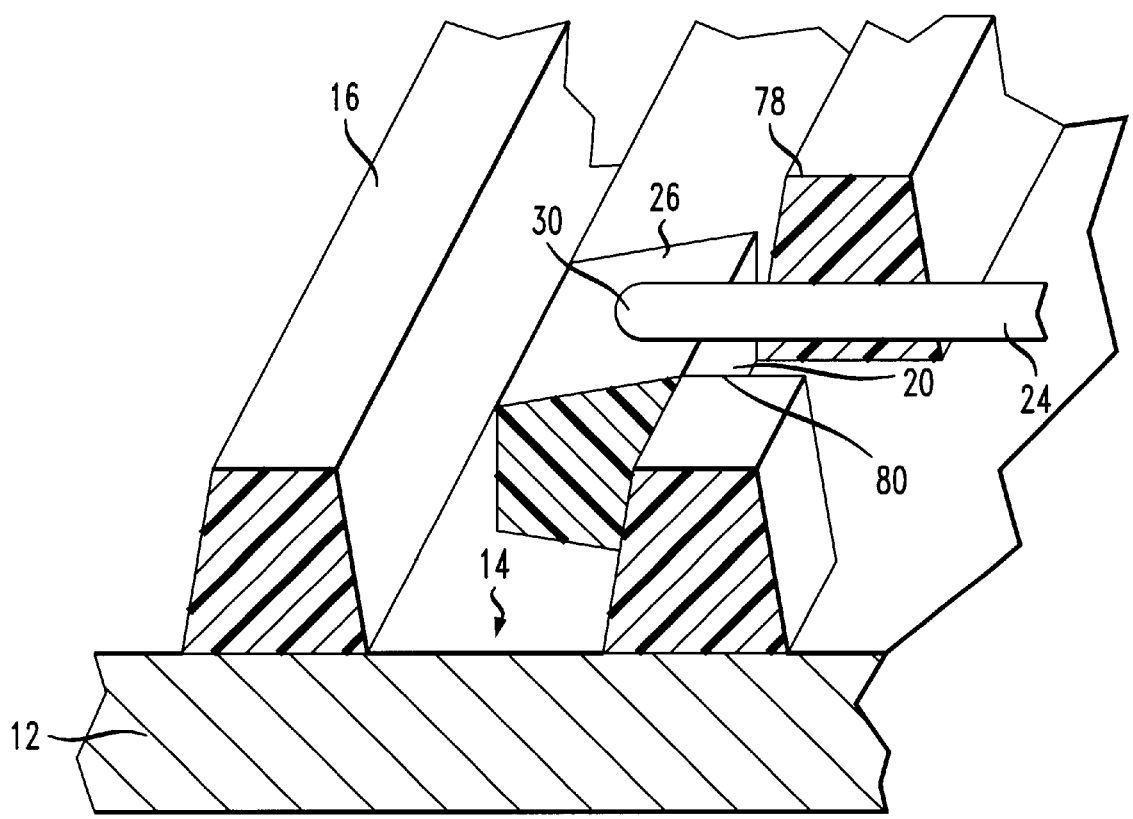
FIG. 2 shows the removal of the section of FIG. 1.

With reference to FIGS. 1 and 2, a wafer includes a substrate 10, which may be silicon, doped silicon, epitaxial silicon, or other semiconductor material. In general, the term substrate is used to refer to any material having a surface upon which other materials can be deposited. Typically, microelectronic devices are formed on the substrate. Such devices may have features, such as photoresist patterns, which have a width or line width of about 1, or less, and a height of around 1–5 micrometers ($\mu$). For ensuring the successful manufacture of microelectronic devices formed upon the substrate 10, the dimensions are generally required to be within specified limits. Thus accurate measurement of at least one of these critical dimensions is desired.

The substrate may have a layer 12, or stack of layers of additional materials, such as silicon oxide, silicon nitride, aluminum, titanium nitride, polysilicon, and the like, deposited thereon. The surface of this layer 12 may be either planar or patterned. An upper surface 14 of the substrate 10 or uppermost layer 12, where present, is referred to herein as the substrate surface.

For the purpose of describing this invention, we shall refer to features which consist of runners or lines 16 of photoresist material having a width W, a height H, and a pitch denoted by P. However, the technique is also applicable to other surface features having a variety of geometries.

Also important, and previously not readily measured, is the variation in the width W along the length (i.e., the longest dimension) L of the runner. Another important parameter is the force F required to disbond a lower surface 20 of the runner (or other feature), or a portion thereof, from the substrate surface. The present method allows accurate measurement of the width W, the height H, the variation in these features along the length L, and the force F required to disbond a section 22 of the runner. Additionally, the method allows examination of the lower surface of the runner.

To remove the section 22 of the photoresist for examination or measurement, a tool having a probe 24 is used to apply a force to the runner 16 at the position where the sample is to be removed, as shown in FIG. 1. The probe in FIG. 1 is angled such that its length is generally perpendicular to a sloping, generally vertical side 26 of the runner. A force is applied in the direction of arrow f. It is also contemplated that the force may be applied at a variety of angles and on a variety of surfaces of the runner 16, depending on a number of factors, such as the shape of the runner, the force bonding the runner to the substrate, and the resistance of the photoresist to fracture in a plane perpendicular to the plane of the substrate surface.

A tip 30 of the probe pushes side of the runner, which bows under the applied pressure, and finally fractures in two positions to form the section (obviously, if a section is removed from an end of a runner, the runner need only be fractured in one position). The lower surface 20 of the section is disbanded from the substrate surface in the process. As the height H of the runner is generally greater than the width W, the force usually topples the section over, onto its side, as shown in FIG. 2.

Typically, the photoresist runner has a width W of from about 0.1 to about $1\mu$. The section removed in this way is preferably less than about $10\mu$ in length, more preferably, about $1\mu$ in length (i.e., typically longer in length than in width), although longer sections may be removed if desired, for example by using two probes spaced apart along the length of the runner.

The force needed to remove the section 22 depends on a number of factors, including the width W of the runner, the type of photoresist, or other material, and the degree of bonding to the substrate surface. A force in the range of 100 to 1000 micro-Newtons is generally sufficient to remove a section of photoresist.

The probe 24 is preferably formed from glass or quartz drawn into the shape of a needle. The tip 30 of the probe may be rounded, as shown in FIGS. 1 and 2, or formed with a wedge, or other suitable shape. The tip preferably has a width of from about 100 nanometers to about 2 microns (i.e., up to about the length of the section to be removed).

Figure 3:
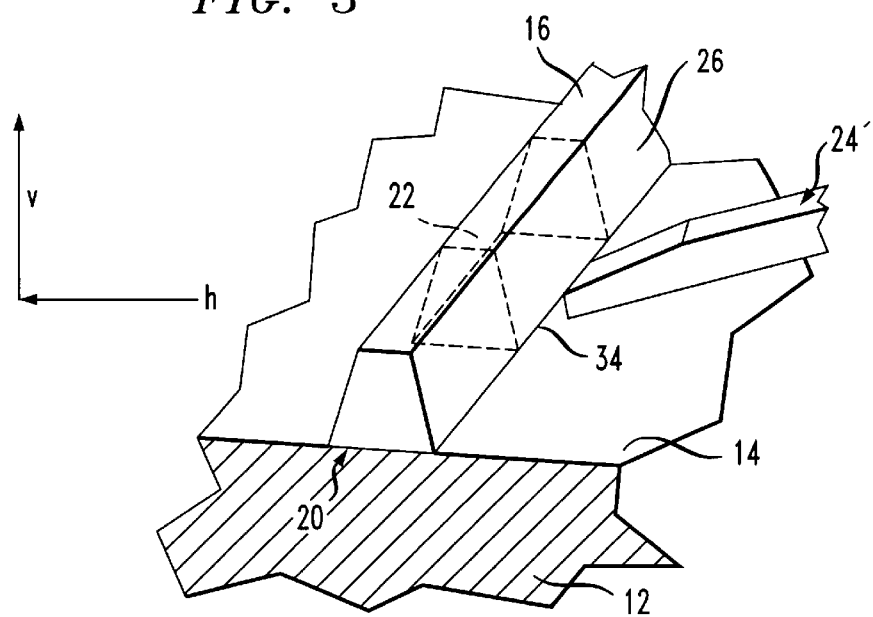
FIG. 3 shows the removal of a section of a photoresist runner with a wedge-shaped probe.

FIG. 3 shows a wedge shaped probe 24'. To form the wedge, the tip 30 of a glass probe is filed down to the desired shape. The wedge shaped probe may be used as a shovel. For this purpose, it is angled at the base 34 of one of the sides 26 of the section 22 to be removed and the section is sliced from the underlying substrate surface 14, perhaps with a small amount of the underlying substrate. By using first a generally horizontal peeling movement of the probe in direction h and then a vertical lifting movement in direction v, the section 22 is first severed from the substrate surface then lifted upwards and away from the adjacent portions of the runner.

A suitable tool for applying the force is a micromanipulator having the capability for sub-micron adjustments. A variety of micromanipulators are available for medical and bioengineering purposes and which can be adapted to the present invention. These include Atomic Force Microscopes and Probe Microscopes. One suitable micromanipulator is sold under the trade name Microzoom 2 and is available form Bausch and Lomb. It is capable of submicron adjustments in the 10–100 nanometer (nm) range. For smaller features, micromanipulators which operate on the Angstrom level are available.

Figure 4:
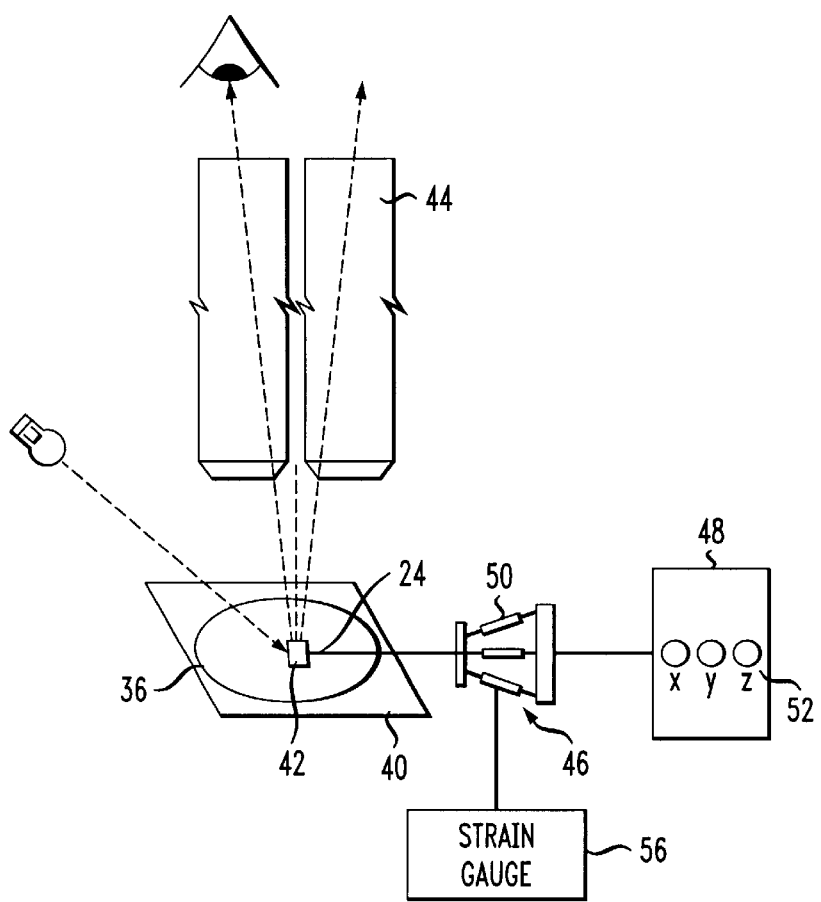
FIG. 4 is a schematic diagram of a micromanipulator incorporating the probe pf FIGS. 1 and 2 for removing a section of a topographical feature, according to the present invention.

With reference to FIG. 4, a preferred micromanipulator is shown schematically (not to scale). The micromanipulator guides a core sectioning end piece (i.e., the probe 24) using a long working distance light microscope, allowing a specific site on the wafer to be targeted. Specifically, the wafer 36 is positioned on the stage 40 of the light microscope and the photoresist runners of an integrated circuit 42 printed thereon are viewed by an operator through the magnifying optical system 44 of the light microscope. The probe of the micromanipulator is controlled via a linkage 46 and a drive system 48 which allows precise positioning of the probe 24 on the micrometer order in x, y, and z coordinates. The linkage 46 may include a number of actuators 50, such as piezoelectric elements, which extend or contract by about $\frac{1}{1000}$ of their length, on application of a drive voltage, to move the probe. The operator adjusts the position of the probe with x, y, and z controls 52 until the tip 30 of the probe 24 is adjacent the section of the runner to be removed. Then, a force is applied to the probe to remove the section.

Figure 5:
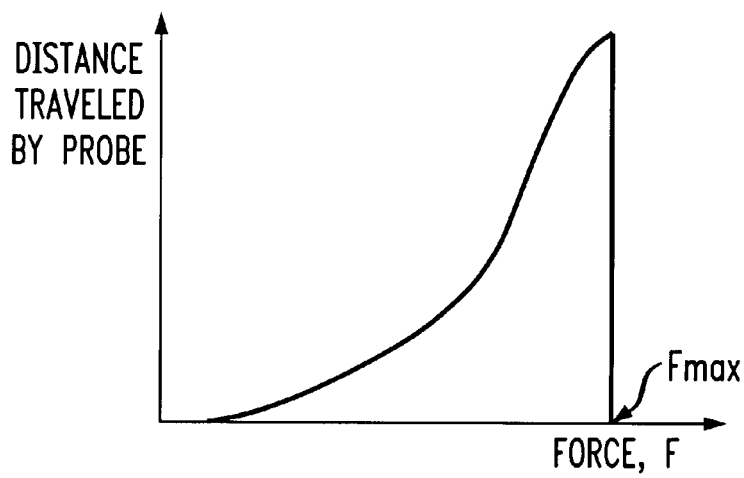
FIG. 5 is a plot of applied force against distance traveled by the probe during core sectioning.

Optionally, the micromanipulator includes one or more strain gauges 56, which may be associated with the piezoelectric elements 50, for measuring the force F applied as the section is first bent and them removed. As shown in FIG. 5, the force increases as the probe 24 pushes the section 22, typically reaching a maximum just before the connections to the rest of the runner, at the ends of the section, are severed. This maximum force $F_{max}$ can be used as a measure of the degree of bonding of the photoresist material to the substrate surface 14.

The photoresist section 22 peels relatively cleanly from the substrate surface 14, with little visible damage to the section removed or to the underlying substrate. Because only a small section of the photoresist is removed, the wafer 36 and the integrated circuit 42 formed thereon are undamaged, i.e., their functions are not impaired, provided that the section 22 taken for analysis is not removed from a part of the photoresist which is critical to the function of the device 42. only local regions of the photoresist pattern are destroyed. Since only a very small proportion of the photoresist pattern is that which is critical to the device function, a majority of the photoresist on the wafer is thus available for sampling without damage to the devices thereon. Additionally, a portion of the photoresist may be patterned specifically for sampling, if desired, allowing one or more sections to be removed without any danger of damage to the functioning of the wafer devices.

Figure 6:
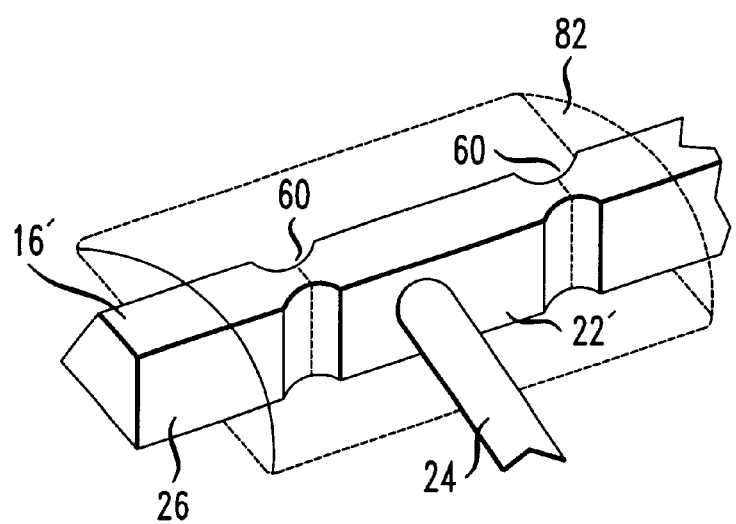
FIG. 6 is a perspective view of a photoresist runner formed with stress concentration zones which fracture preferentially during removal of a section of the runner.

To facilitate sectioning, the photoresist may be patterned with indents or stress concentration zones 60. FIG. 6 shows a runner 16' with two spaced stress concentration zones 60. The resist runner severs preferentially when pressure is applied to the intermediate section 22' of the photoresist runner. Obviously, the dimensions of these stress concentration zones are not representative of the dimensions of the remainder of the photoresist and the subsequent measurement techniques should avoid these areas of the section.

Figure 7:
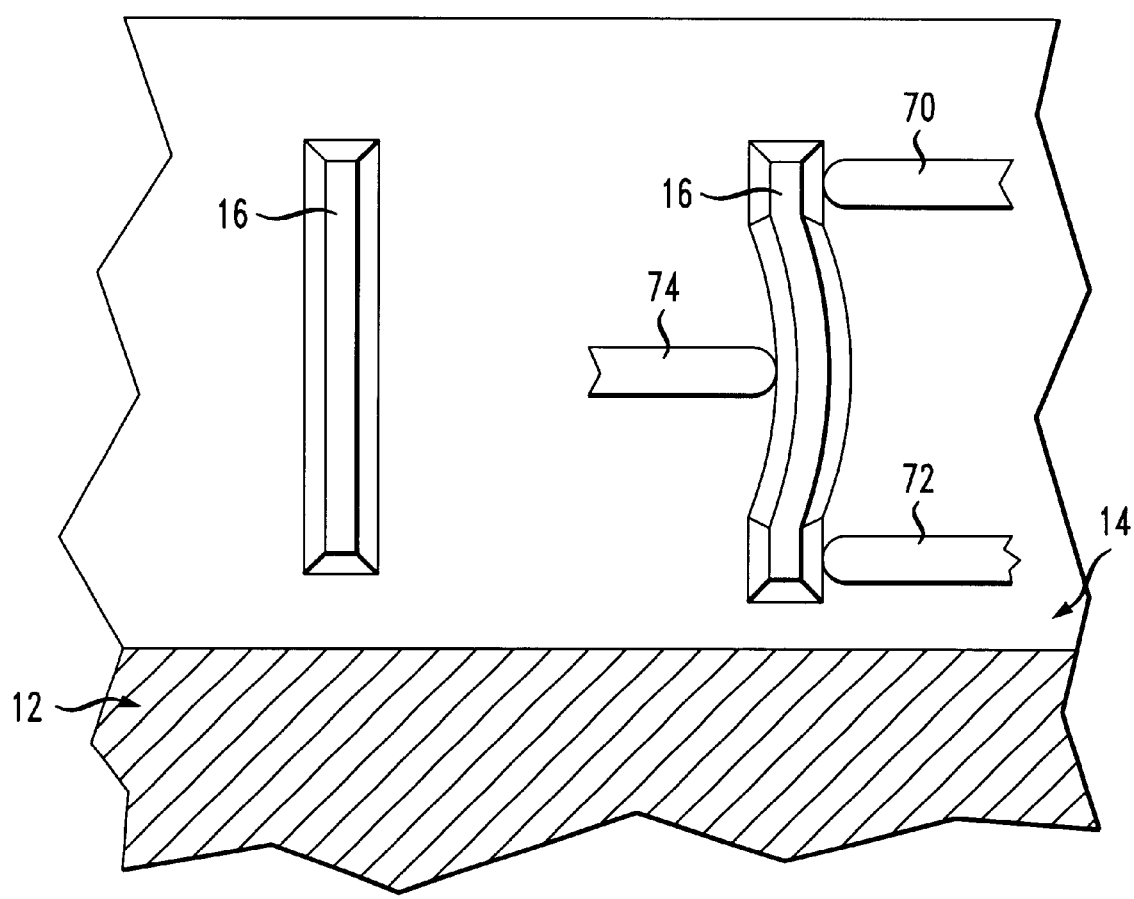
FIG. 7 is a top view of the surface of the substrate showing removal of a section of photoresist using a three point probe according to a second embodiment of the present invention.

While the above examples describe the micromanipulator as having a single probe 24, it is also contemplated that multiple probes may be used in the removal process. For example, three, four, or more probes may be used in tandem to carry out the sectioning. FIG. 7 shows three probes 70, 72, 74 by way of example. Two of the probes 70, 72 are positioned on one side of the photoresist runner and remain stationary, while the third probe 74 pushes the photoresist from the other side. The runner tends to cleave preferentially adjacent the two stationary probes. This allows a more controlled manner of fracture than a single probe. Obviously, the arrangement could be reversed, with two probes pushing and one stationary, or all three pushing. Other multiple probe arrangements are also contemplated.

After sectioning, the section 22 is removed from the substrate 12. In one method, a static electrical charge is applied to the tip 30 of the probe, for example, by rubbing the end of the probe against a fabric which creates a net positive or negative static charge at the tip of the probe. The probe tip is placed in contact with one of the surfaces of the section. FIG. 2 shows the probe tip in contact with the uppermost surface of the section, which originally formed part of the side 26 of the runner. The charged surface of the probe tip 30 attracts the section to the probe with sufficient force to allow the section to be lifted from the substrate surface 14 and be carried by the probe to a suitable site for examination. Typically, there is sufficient static charge in the ambient air to charge the probe, such that separate charging is not necessary.

Alternatively, the section may be gripped between two probes, which act like fingers, carrying the section to the examination site.

To release the section from the probe onto an examination surface, the static charge of the probe 24 may be discharged, allowing the sample to drop. Or, the section may be brushed gently against the examination surface to dislodge it from the probe. Yet another way to remove the section is to place the section on a surface which attracts the section, such as charged or adhesive surface, for example, a carbon film. The section sticks to the film and the probe can be removed.

A variety of tests may then be carried out on the section 22 without risk of damage to the wafer from which it has been removed. Critical dimensions of the photoresist runner, such as height H and width W, can be measured, for example, with a high resolution, high voltage SEM, along the length L of the section. From these measurements, a measure of the degree of variance in dimension along the length can be calculated. Additionally, each surface of the section can be examined for damage or other characteristics, including the lower surface 20 of the runner section. Features which are purposely non-uniform along their length can also be studied using these techniques.

If the measurements made on the runner fall outside predetermined acceptable ranges, the wafer from which the section has been taken can be subjected to reprocessing, for example, by stripping the photoresist pattern and reapplying a fresh pattern. The sampling can be repeated any number of times until the measurements fall within the desired ranges. If the measurements are acceptable, the wafer can go on to further processing, if this is intended, or sent directly for packaging.

In another embodiment, the probe 24 is used primarily to dislodge the section from the substrate surface, while a second tool is used to cleave the photoresist in two positions 78, 80, at either end of the section 22. For example, an FIB tool, such as one generating a fine beam of gallium ions of about 5 nm in diameter, is used to cut two spaced vertical cross sections 78, 80 through the photoresist runner 16, down to the underlying substrate surface 14, or slightly below it. The probe is then applied in essentially the same manner as previously described, to dislodge the base 20 of the section from the underlying substrate surface 14. While the focussed ion beam may damage the cut ends of the section to some degree, the middle portion of the section length remains substantially undamaged by the beam and dimensions measured in this middle portion are representative of those of the photoresist runner prior to removal.

In some cases, it may be desirable to use a solvent to aid in the disbanding of the section from the substrate surface or as a means of evaluating the bonding force between the photoresist runner and the substrate surface. Polar or non-polar solvents may be used, as appropriate, such as alcohol or water. The reduction in bonding force measured when a particular solvent is used, as compared to the bonding force without solvent, is used as an indication of the nature of the interface between the substrate surface and the runner. A micropipette is used to apply a droplet 82 the solvent over the photoresist in the area of the section 22, 22' to be taken, as shown in FIG. 6.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A method of integrated circuit manufacturing comprising:
   forming a raised topographical feature on a semiconductor substrate surface;
   removing a section of the feature from the substrate surface, including:
      applying a force with a probe tip to a side of the feature to displace the section from the substrate surface and at least one adjacent portion of the feature; and examining the removed section to determine whether a selected characteristic of the topographical feature meets a predetermined standard.

2. The method of claim 1, wherein the step of examining the removed section includes:

measuring a critical dimension of the section in at least one position along a length of the section.

3. The method of claim 2, wherein the step of examining the section includes:

measuring the critical dimension at a plurality of positions along the length of the section to determine a variation in the critical dimension along the length of the section.

4. The method of claim 2, wherein the critical dimension includes one of width and height of the section.

5. The method of claim 1, wherein the section is less than about 10 microns in length.

6. The method of claim 1, wherein the step applying the force with the probe tip to the side of the feature includes:

applying the force to cleave the section from the at least one adjacent portion of the feature.

7. The method of claim 1, wherein the step of removing the section includes, prior to the step of applying the force with the probe tip to the side of the feature to displace the section from the substrate surface and the adjacent portion of the feature:

cleaving the section from the at least one adjacent portion of the feature.

8. The method of claim 7, wherein the step of cleaving includes;

cutting a cross section through the feature generally perpendicular to the plane of the substrate surface using a focussed ion beam.

9. The method of claim 1, further including:

transporting the displaced section to a site at which the step of examining the section is carried out.

10. The method of claim 9, wherein the step of transporting the section includes:

electrostatically charging the tip of the probe; and contacting the displaced section with the tip of the probe to adhere the section to the probe.

11. The method of claim 1, wherein the probe tip is wedge shaped and the step of applying a force includes:

applying a force which is generally parallel to the plane of the substrate surface to peel the section from the substrate surface; and then applying a force which is substantially perpendicular to the plane of the substrate surface to lift the section from the surface.

12. The method of claim 1, wherein the step of examining the removed section includes:

examining the section with a scanning electron microscope.

13. The method of claim 12, wherein the step of examining with a scanning electron microscope includes:

examining a base of the section which, prior to removal was in contact with the substrate surface.

14. The method of claim 1, wherein the step of removing a section includes:

removing the section without damaging functional capabilities of an integrated circuit associated with the feature.

15. The method of claim 14, further including either one of:

1) further processing the undamaged integrated circuit if the step of examining the removed section reveals that the selected characteristic of the topographical feature meets the predetermined standard; and 2) removing the feature from the substrate surface if the step of examining the removed section reveals that the selected characteristic of the topographical feature does not meet the predetermined standard.

16. The method of claim 1, wherein the feature includes a strip of photoresist.

17. The method of claim 1, wherein the step of removing the section includes:

measuring the force applied by the probe tip.

18. The method of claim 1, wherein the force applied by the probe is from about 100 to about 1000 micro-Newtons.

19. The method of claim 1, wherein the tip of the probe has a width of from about 100 nanometers to about 2 micrometers.

20. The method of claim 1, wherein the step of forming the raised topographical feature includes:

forming a narrowed region in the feature which fractures preferentially when the force is applied.

21. A method of integrated circuit testing comprising:

forming a raised topographical feature on a semiconductor substrate surface;

applying a force to a side of the topographical feature in a direction generally parallel with the substrate surface which force causes a section of the feature to be severed from at least one adjacent remaining portion of the feature and disbonds the section from the substrate surface; and examining the removed section to determine whether a selected characteristic of the topographical feature meets a predetermined standard.

* * * * *